(12) United States Patent
Lea et al.

(10) Patent No.: US 11,747,494 B2
(45) Date of Patent: Sep. 5, 2023

(54) ION FILTER USING APERTURE PLATE WITH PLURALITY OF ZONES

(71) Applicant: Plasma-Therm LLC, St. Petersburg, FL (US)

(72) Inventors: Leslie Michael Lea, East Hagbourne (GB); Linnell Martinez, Seminole, FL (US); Michael Morgan, Redington Beach, FL (US); Russell Westerman, Land O' Lakes, FL (US)

(73) Assignee: Plasma-Therm LLC, St. Petersburg, FL (US)

( * ) Notice: Subject to any disclaimer, the term of this patent is extended or adjusted under 35 U.S.C. 154(b) by 14 days.

(21) Appl. No.: 16/907,503

(22) Filed: Jun. 22, 2020

(65) Prior Publication Data
US 2020/0319356 A1    Oct. 8, 2020

Related U.S. Application Data

(62) Division of application No. 15/813,777, filed on Nov. 15, 2017, now abandoned.
(60) Provisional application No. 62/424,360, filed on Nov. 18, 2016.

(51) Int. Cl.
*G01T 1/28*    (2006.01)
*H01J 37/32*    (2006.01)
(Continued)

(52) U.S. Cl.
CPC .................. *G01T 1/28* (2013.01); *H01J 3/14* (2013.01); *H01J 37/32357* (2013.01);
(Continued)

(58) Field of Classification Search
CPC .......... G01T 1/28; H01J 3/14; H01J 37/32357; H01J 37/32422; H01J 37/32577;
(Continued)

(56) References Cited

U.S. PATENT DOCUMENTS 4,950,376 A * 8/1990 Hayashi ............. H01J 37/3299
204/298.34
6,250,250 B1 * 6/2001 Maishev ........... H01J 37/32568
156/345.46
(Continued)

FOREIGN PATENT DOCUMENTS

EP   0801413    10/1997
JP   H05205682   8/1993

*Primary Examiner* — David E Smith
(74) *Attorney, Agent, or Firm* — Harvey S. Kauget; Burr & Forman LLP

(57) ABSTRACT

The present invention provides a method for using ion filtering to adjust the number of ions delivered to a substrate. The method comprising a process chamber being provided that is operatively connected to a plasma source. The substrate is provided on a substrate support that is provided within the process chamber. An electrical bias source is provided that is operatively connected to an aperture plate that is provided in the process chamber. The substrate on the substrate support is processed using a plasma generated using the plasma source. A variable bias voltage from the electrical bias source is applied to the aperture plate during the plasma processing of the substrate. The plasma processing of the substrate can further comprise exposing the substrate to a plasma time division multiplex process which alternates between deposition and etching on the substrate.

17 Claims, 15 Drawing Sheets

(51) Int. Cl.
*H01J 3/14* (2006.01)
*H01J 49/02* (2006.01)
*H01L 21/78* (2006.01)

(52) U.S. Cl.
CPC .. *H01J 37/32422* (2013.01); *H01J 37/32577* (2013.01); *H01J 37/32633* (2013.01); *H01J 37/32871* (2013.01); *H01J 49/02* (2013.01); *H01L 21/78* (2013.01)

(58) Field of Classification Search
CPC ........... H01J 37/32633; H01J 37/32871; H01J 49/02; H01J 21/78
See application file for complete search history.

(56) References Cited

U.S. PATENT DOCUMENTS

| | | |
|---|---|---|
| 6,565,717 B1 | 5/2003 | Leet et al. |
| 8,802,545 B2 | 8/2014 | Johnson et al. |
| 2003/0159782 A1 | 8/2003 | Brcka |
| 2006/0137821 A1 | 6/2006 | Howald et al. |
| 2007/0234955 A1* | 10/2007 | Suzuki .............. C23C 16/45565 438/586 |
| 2008/0099426 A1* | 5/2008 | Kumar ...................... G03F 1/80 216/12 |
| 2010/0206846 A1* | 8/2010 | Nishimura ........ C23C 16/45574 156/345.48 |
| 2010/0244699 A1* | 9/2010 | Dine ................. H01J 37/32091 315/111.51 |
| 2011/0303641 A1* | 12/2011 | Mahadeswaraswamy .................. H01J 37/32724 156/345.52 |
| 2013/0081761 A1* | 4/2013 | Sawada ............. H01J 37/32422 156/345.3 |
| 2013/0230971 A1* | 9/2013 | Geerpuram ....... H01L 21/67011 438/460 |
| 2015/0221553 A1* | 8/2015 | Ouye ............... H01L 21/68742 156/345.37 |
| 2015/0255243 A1* | 9/2015 | Godet ............... H01J 37/32091 216/38 |

* cited by examiner

ION FILTER USING APERTURE PLATE WITH PLURALITY OF ZONES

CROSS REFERENCES TO RELATED APPLICATIONS

This application is a divisional of copending patent application Ser. No. 15/813,777 filed Nov. 15, 2017, entitled: ION FILTER USING APERTURE PLATE WITH PLURALITY OF ZONES which claims priority from and is related to commonly owned U.S. Provisional Patent Application Ser. No. 62/424,360 filed Nov. 18, 2016, entitled: ION FILTER, the contents of all applications are incorporated herein.

FIELD OF THE INVENTION

Invention relates to the field of charged particle sources including plasma sources for direct etching and deposition, broad-beam ion sources for ion beam deposition and etching, and electron sources for surface modification.

BACKGROUND OF THE INVENTION

Plasma processing apparatus used to etch silicon wafers and other substrates or to deposit a variety of materials on to various substrates can be very effective for the production of semiconductor devices and other related systems. In its basic form, plasma is generated in a source region from appropriate precursor gases forming positive ions of the gas, electrons and neutral radicals. At the wafer, for an etch process, there may be a requirement for a more chemical etch primarily utilizing the neutral radicals or a more physical etch using accelerated ions. In many cases the etching requires a combination of ions and neutral radicals.

The plasma may be generated by a variety of means such as for example in an Inductively Coupled Plasma source (ICP), a Capacitively Coupled Plasma source (CCP), a microwave plasma source or an Electron Cyclotron Resonance source (ECR). It is frequently the case that the plasma produced while being usable for the required purpose, does not have the ideal ratio of numbers of ions to numbers of chemically reactive radicals to achieve the most effective plasma processing of the wafer. It is particularly the case as requirements become stronger to etch material at ever faster rates that simply increasing the flow of gas to the plasma source and the level of power used to dissociate and ionize the gas, results in a plasma where there are too many ions in relation to the number of neutral radicals and as the etching process proceeds the excess numbers of ions may cause damage to the structures being etched.

The problem described above has been addressed to some extent by various individuals and groups over the last twenty years or more, generally in a fairly simplistic manner which has provided sufficient ion number reduction for their purposes, but does not have the flexibility for use in plasma processing apparatus that will carry out different processes at different times. Prior art methods have been described for directing ions to loss surfaces between the plasma source and wafer using magnetic fields which may be created either by permanent magnets or electromagnets. These techniques rely on the trapping of electrons on the magnetic field lines which then intersect a loss surface. The locally produced electric fields ensure that ions are also lost to the surfaces. Use of electromagnets increases the flexibility of the technique as some adjustment can be made to the degree of ion loss. The magnet based techniques are limited in the pressure range where they may be used as with increasing pressure there is an increased probability that electrons will not remain trapped on the magnetic field lines because they suffer collisions with neutral gas atoms or molecules and randomly walk across the field lines. At pressures above 10 to 20 mTorr, the technique becomes less effective. See for example U.S. Patent Publication to Lea et al. (U.S. Patent Publication 2002/0185226).

Described more widely in the prior art is the use of a perforated plate or grid, usually manufactured out of a metal that is compatible with the plasma process, such as aluminum or anodized aluminum. This grid or perforated plate is placed across the process chamber between the plasma source and the wafer. It relies on the high probability of loss of ion and electron pairs to the surface of the plate and to the sides of the apertures on contact. Some neutral radicals will be lost to the perforated plate, but the probability of loss is typically quite a lot less than that for the ion/electron pairs and so the ratio of ions to neutral radicals is reduced with the perforated plate in position compared with the ratio without the plate. Some prior art examples are Savas et al. (U.S. Pat. No. 5,811,022); Lea et al. (U.S. Patent Publication 2002/0185226); Antonelli et al. (U.S. Pat. No. 8,084,339); and Martinez et al. (U.S. Pat. No. 8,980,764).

Ion loss will be greater if the transparency of the grid is reduced. That is the area of the apertures compared to the overall area of the plate is reduced. Ion loss will also be increased if the aperture aspect ratio (depth divided by diameter) is increased (e.g., the plate is thicker and/or the aperture diameter is smaller). As the aperture aspect ratio increases, charged species passing through an aperture have increased probability of contacting the side wall of the aperture and being lost. Antonelli et al. (U.S. Pat. No. 8,084,339) shows the typical ion loss to be expected as the plate thickness to aperture diameter is increased.

There is a need to vary the ion to radical number ratio across the wafer or conversely obtain the same or similar ion to radical number ratio across the wafer when the plasma source produces an ion to radical number ratio that varies with position across the source, where the process requires, adjustment to the ion to radical number ratio as a function of time, or both.

Nothing in the prior art provides the benefits attendant with the present invention.

Therefore, it is an object of the present invention to provide an improvement which overcomes the inadequacies of the prior art devices and which is a significant contribution to the advancement of using a charged particle source.

Another object of the present invention is to provide a method for using ion filtering to adjust the number of ions delivered to a substrate, the method comprising: providing a process chamber; providing a plasma source operatively connected to the process chamber; providing a substrate support within the process chamber; providing the substrate onto the substrate support; providing a plurality of electrical bias sources; providing an aperture plate in the process chamber, said aperture plate having a plurality of aperture plate zones, wherein at least two aperture plate zones of the plurality of aperture zones are operatively connected to a separate bias of the plurality of electrical bias sources; generating a plasma using the plasma source; processing the substrate on the substrate support using the generated plasma; and applying a separate bias voltage from the plurality of electrical bias sources to at least two aperture zones of the plurality of aperture zones during the plasma processing of the substrate.

Yet another object of the present invention is to provide a method for using ion filtering to adjust the number of ions delivered to a substrate, the method comprising: providing a process chamber; providing a plasma source operatively connected to the process chamber; providing a substrate support within the process chamber; providing the substrate onto the substrate support; providing a plurality of electrical bias sources; providing a plurality of aperture plates in the process chamber, at least one of the plurality of aperture plates having a plurality of aperture plate zones, wherein at least two aperture plate zones of the plurality of aperture plate zones are operatively connected to a separate bias of the plurality of electrical bias sources; generating a plasma using the plasma source; processing the substrate on the substrate support using the generated plasma; and applying a separate bias voltage from the plurality of electrical bias sources to at least two aperture plate zones of the plurality of aperture plate zones during the plasma processing of the substrate.

Still yet another object of the present invention is to provide a method for using ion filtering to adjust the number of ions delivered to a substrate, the method comprising: providing a process chamber; providing a plasma source operatively connected to the process chamber; providing a substrate support within the process chamber; providing the substrate onto the substrate support; providing an electrical bias source; providing an aperture plate in the process chamber, said aperture plate being operatively connected to the electrical bias source; generating a plasma using the plasma source; processing the substrate on the substrate support using the generated plasma; and applying variable bias voltage from the electrical bias source to the aperture plate, said bias voltage being varied as a function of time during the plasma processing of the substrate.

Another object of the present invention is to provide a method for using ion filtering to adjust the number of ions delivered to a substrate, the method comprising: providing a process chamber; providing a plasma source operatively connected to the process chamber; providing a substrate support within the process chamber; providing the substrate onto the substrate support; providing an electrical bias source; providing a plurality of aperture plates in the process chamber, at least one of said plurality of aperture plates being operatively connected to the electrical bias source; generating a plasma using the plasma source; processing the substrate on the substrate support using the generated plasma; and applying variable bias voltage from the electrical bias source to at least one of the plurality of aperture plates, said bias voltage being varied as a function of time during the plasma processing of the substrate.

Yet another object of the present invention is to provide a method for using ion filtering to adjust the number of ions delivered to a substrate, the method comprising: providing a process chamber; providing a plasma source operatively connected to the process chamber; providing a substrate support within the process chamber; providing the substrate onto the substrate support; providing a plurality of electrical bias sources; providing an aperture plate in the process chamber, said aperture plate having a plurality of aperture plate zones, wherein at least two aperture plate zones of the plurality of aperture plate zones are operatively connected to a separate bias of the plurality of electrical bias sources; generating a plasma using the plasma source; processing the substrate on the substrate support using the generated plasma; and applying a separate bias voltage from the plurality of electrical bias sources to at least two aperture plate zones of the plurality of aperture plate zones during the plasma processing of the substrate, at least one bias voltage being varied as a function of time during the plasma processing of the substrate.

Still yet another object of the present invention is to provide a method for using ion filtering to adjust the number of ions delivered to a substrate, the method comprising: providing a process chamber; providing a plasma source operatively connected to the process chamber; providing a substrate support within the process chamber; providing the substrate onto the substrate support; providing a plurality of electrical bias sources; providing a plurality of aperture plates in the process chamber, at least one of the plurality of aperture plates having a plurality of aperture plate zones, wherein at least two aperture plate zones of the plurality of aperture plate zones is operatively connected to a separate bias of the plurality of electrical bias sources; generating a plasma using the plasma source; processing the substrate on the substrate support using the generated plasma; and applying a separate bias voltage from the plurality of electrical bias sources to at least two aperture plate zones of the plurality of aperture plate zones during the plasma processing of the substrate, at least one bias voltage being varied as a function of time during the plasma processing of the substrate.

Another object of the present invention is to provide an ion filtering system comprising: a process chamber; a plasma source operatively connected to the process chamber; a substrate support positioned within the process chamber; a plurality of electrical bias sources; and an aperture plate in the process chamber, said aperture plate having a plurality of aperture plate zones, wherein at least two aperture plate zones of the plurality of aperture plate zones are operatively connected to a separate bias of the plurality of electrical bias sources.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The invention described here provides greater control of the ion numbers reaching the wafer than the basic design of prior art. The invention described here is in particular intended for application to Deep Reactive Ion Etching (DRIE) as normally applied to the use of the "Bosch process" invented by workers at Robert Bosch in Germany, Laermer and Schilp U.S. Pat. No. 5,498,312, however this is not to preclude its use for other etch or deposition applications.

In the Bosch DRIE process, anisotropic etching of features into the silicon as defined by a mask on the surface of the silicon takes place by repetition of an etch and deposition process cycle many times. As the process proceeds through one cycle, in the deposition step a passivation layer is deposited on all surfaces. At the start of the following etch step (or frequently defined as a first etch sub-step), ions from the plasma are accelerated to the wafer and remove the passivating material from the base of the feature being etched. In the remainder of the etch step (or the second etch sub-step) silicon is etched isotropically using the neutral radicals produced in the plasma. As the cycle is repeated the feature defined by the mask is etched further down into the silicon wafer. It is of particular importance to the effective operation of the process that in the first etch sub-step the ion flux is well defined in terms of a number of parameters, while in the second etch sub-step and in the deposition step the number of ions should be small as they do not contribute significantly to either step and can have the detrimental effect if in too great numbers to reducing the etch selectivity to the mask so that the mask is eroded too quickly and the feature ceases to be defined laterally before it has achieved sufficient depth.

In relation to the Bosch DRIE process it is desirable to increase aperture plate bias on the aperture plate or between aperture plates or sections of aperture plates, so that during the deposition step and second etch sub-step to reduce the number of ions reaching the wafer and so reduce the mask erosion, thereby increasing the selectivity of the overall process to the mask. The level of aperture plate bias would be reduced during the first etch sub-step so that sufficient numbers of ions can be accelerated to the wafer to achieve the required directional passivation removal. For an ion filter divided into annular aperture zones or into other aperture zone geometries, the bias applied to the driven aperture plate in each sector can be varied as appropriate to achieve a highly uniform ion density across the wafer during the first etch sub-step and also a very low number of ions to the wafer during the second etch sub-step and the deposition step. If the ion filter is not divided into a number of annular aperture zones, time varying bias may still be applied in the manner described in this invention for use with regard to the Bosch DRIE process or any other process that requires a time variation in the number of ions reaching the wafer.

Another feature of the present invention is to provide a method for using ion filtering to adjust the number of ions delivered to a substrate. The method comprising a process chamber being provided that is operatively connected to a plasma source. The substrate is provided on a substrate support that is provided within the process chamber. The substrate can further comprise a semiconductor wafer on tape on a frame. A plurality of electrical bias sources are provided. An aperture plate having a plurality of aperture plate zones is provided in the process chamber, wherein at least two aperture plate zones of the plurality of aperture plate zones are operatively connected to a separate bias of the plurality of electrical bias sources. The aperture plate can further comprise a plurality of apertures. At least one of the plurality of aperture plate zones can further comprise an annular geometry. The substrate on the substrate support is processed using a plasma generated using the plasma source. A separate bias voltage from the plurality of bias sources is applied to at least two aperture plate zones of the plurality of aperture plate zones during the plasma processing of the substrate. The aperture plate can be actively cooled for a period of time during the plasma processing of the substrate. At least one aperture plate zone of the plurality of aperture plate zones can be grounded for a period of time during the plasma processing of the substrate.

Yet another feature of the present invention is to provide a method for using ion filtering to adjust the number of ions delivered to a substrate. The method comprising a process chamber being provided that is operatively connected to a plasma source. The substrate is provided on a substrate support that is provided within the process chamber. The substrate can further comprise a semiconductor wafer on tape on a frame. A plurality of electrical bias sources are provided. A plurality of aperture plates is provided in the process chamber wherein at least one of the plurality of aperture plates having a plurality of aperture plate zones, wherein at least two aperture plate zones of the plurality of aperture plate zones are operatively connected to a separate bias of the plurality of electrical bias sources. At least one of the plurality of aperture plates can further comprise a plurality of apertures. At least one of the plurality of aperture plate zones can further comprise an annular geometry. The substrate on the substrate support is processed using a plasma generated using the plasma source. A separate bias voltage from the plurality of electrical bias sources is applied to at least two aperture plate zones of the plurality of aperture plate zones during the plasma processing of the substrate. At least one aperture plate zone of the plurality of aperture plate zones can be actively cooled for a period of time during the plasma processing of the substrate. At least one aperture plate zone of the plurality of aperture plate zones can be grounded for a period of time during the plasma processing of the substrate. At least one of the plurality of aperture plates can be positioned non-planar to at least one of the plurality of aperture plates during the plasma processing of the substrate. At least one of the plurality of aperture plates can be positioned non-parallel to at least one of the plurality of aperture plates during the plasma processing of the substrate.

Still yet another feature of the present invention is to provide a method for using ion filtering to adjust the number of ions delivered to a substrate. The method comprising a process chamber being provided that is operatively connected to a plasma source. The substrate is provided on a substrate support that is provided within the process chamber. The substrate can further comprise a semiconductor wafer on tape on a frame. An electrical bias source is provided that is operatively connected to an aperture plate that is provided in the process chamber. The aperture plate can further comprise a plurality of apertures. The substrate on the substrate support is processed using a plasma generated using the plasma source. A variable bias voltage from the electrical bias source is applied to the aperture plate during the plasma processing of the substrate. The aperture plate can be actively cooled for a period of time during the plasma processing of the substrate. The aperture plate can be grounded for a period of time during the plasma processing of the substrate. The plasma processing of the substrate can further comprise exposing the substrate to a plasma time division multiplex process which alternates between deposition and etching on the substrate.

Another feature of the present invention is to provide a method for using ion filtering to adjust the number of ions delivered to a substrate. The method comprising a process chamber being provided that is operatively connected to a plasma source. The substrate is provided on a substrate support that is provided within the process chamber. The substrate can further comprise a semiconductor wafer on tape on a frame. An electrical aperture plate bias source is provided. A plurality of aperture plates that are operatively connected to the electrical aperture plate bias source are provided in the process chamber. At least one of the plurality of aperture plates can further comprise a plurality of apertures. The substrate on the substrate support is processed using a plasma generated using the plasma source. A variable bias voltage from the electrical aperture plate bias source is applied to at least one of the plurality of aperture plates during the plasma processing of the substrate wherein the bias voltage is varied as a function of time. At least one of the plurality of aperture plates can be actively cooled for a period of time during the plasma processing of the substrate. At least one of the plurality of aperture plates can be grounded for a period of time during the plasma processing of the substrate. At least one of the plurality of aperture plates can be positioned non-planar to at least one of the plurality of aperture plates during the plasma processing of the substrate. At least one of the plurality of aperture plates can be positioned non-parallel to at least one of the plurality of aperture plates during the plasma processing of the substrate. The plasma processing of the substrate can further comprise exposing the substrate to a plasma time division multiplex process which alternates between deposition and etching on the substrate.

Yet another feature of the present invention is to provide a method for using ion filtering to adjust the number of ions delivered to a substrate. The method comprising a process chamber being provided that is operatively connected to a plasma source. The substrate is provided on a substrate support that is provided within the process chamber. The substrate can further comprise a semiconductor wafer on tape on a frame. A plurality of electrical aperture plate bias sources is provided. An aperture plate having a plurality of aperture plate zones is provided in the process chamber, wherein at least two aperture plate zones of the plurality of aperture plate zones are operatively connected to a separate bias of the plurality of electrical aperture plate bias sources. At least one of the plurality of aperture plate zones can further comprise an annular geometry. The aperture plate can further comprise a plurality of apertures. The substrate on the substrate support is processed using a plasma generated using the plasma source. A separate bias voltage from the plurality of electrical aperture plate bias sources is applied to at least two aperture plate zones of the plurality of aperture plate zones during the plasma processing of the substrate. At least one aperture plate zone of the aperture plate can be actively cooled for a period of time during the plasma processing of the substrate. At least one aperture plate zone of the aperture plate can be grounded for a period of time during the plasma processing of the substrate. The plasma processing of the substrate can further comprise exposing the substrate to a plasma time division multiplex process which alternates between deposition and etching on the substrate.

Still yet another feature of the present invention is to provide a method for using ion filtering to adjust the number of ions delivered to a substrate. The method comprising a process chamber being provided that is operatively connected to a plasma source. The substrate is provided on a substrate support that is provided within the process chamber. The substrate can further comprise a semiconductor wafer on tape on a frame. A plurality of electrical aperture plate bias sources is provided. A plurality of aperture plates having a plurality of aperture plate zones is provided in the process chamber, wherein at least two aperture plate zones of the plurality of aperture plate zones are operatively connected to a separate bias of the plurality of electrical aperture plate bias sources. At least one of the plurality of aperture plate zones can further comprise an annular geometry. At least one of the plurality of aperture plates can further comprise a plurality of apertures. The substrate on the substrate support is processed using a plasma generated using the plasma source. A separate bias voltage from the plurality of electrical aperture plate bias sources is applied to at least two aperture plate zones of the plurality of aperture plate zones during the plasma processing of the substrate. At least one aperture plate zone of the plurality of aperture plate zones can be actively cooled for a period of time during the plasma processing of the substrate. At least one aperture plate zone of the plurality of aperture plate zones can be grounded for a period of time during the plasma processing of the substrate. At least one of the plurality of aperture plates can be positioned non-planar to at least one of the plurality of aperture plates during the plasma processing of the substrate. At least one of the plurality of aperture plates can be positioned non-parallel to at least one of the plurality of aperture plates during the plasma processing of the substrate. The plasma processing of the substrate can further comprise exposing the substrate to a plasma time division multiplex process which alternates between deposition and etching on the substrate.

Another feature of the present invention is to provide an ion filtering system comprising a process chamber that is operatively connected to a plasma source. A substrate support is positioned within the process chamber along with an aperture plate having a plurality of aperture plate zones. A separate bias of a plurality of electrical aperture plate bias sources is operatively connected to at least two aperture plate zones of the plurality of aperture plate zones of the aperture plate. At least one of the plurality of aperture plate zones of the aperture plate can further comprise an annular geometry. The aperture plate can further comprise a plurality of apertures.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Similar reference characters refer to similar parts throughout the several views of the drawings.

DETAILED DESCRIPTION OF THE INVENTION

Figure 1:
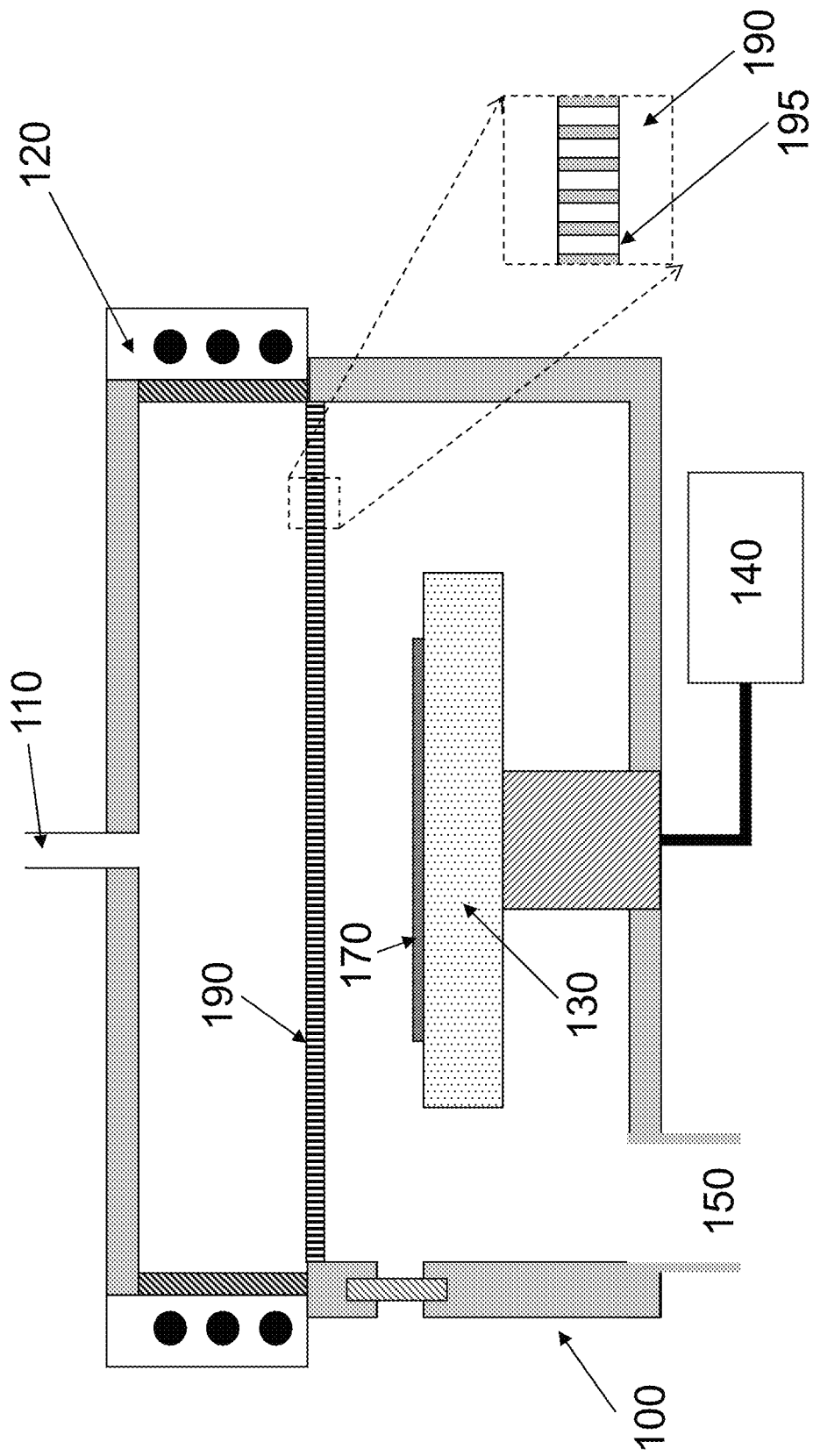
FIG. 1 is a schematic view of a prior art ion filtering system.

The present invention provides several method embodiments for using ion filtering to adjust the number of ions delivered to a substrate. All of the method embodiments of the present invention have a process chamber that is operatively connected to a plasma source wherein the substrate is placed on a substrate support that is provided within the process chamber. All of the method embodiments of the present invention can have the substrate further comprise a semiconductor wafer on tape on a frame. All of the method embodiments of the present invention generate a plasma using the plasma source that is used to process the substrate in the process chamber.

In all of the method embodiments described herein, when an aperture plate is divided into two or more physically separate zones that may be separately biased, it is possible by adjusting the bias voltage to a different level in the two or more aperture plate zones to adjust the degree of ion filtering to a greater or lesser extent in the different zones thereby separately adjusting the number of ions that pass through the filter in each of the physically separate zones. Physically separate zones may be described as having a different location in an appropriate coordinate system for example the Cartesian x, y, z coordinate system or the cylindrical r, theta, z cylindrical coordinate system. The number of ions delivered to the substrate may be described as "spatially adjusted" when a different degree of ion filtering has been selected in different aperture plate zones. A change to the number of ions reaching the substrate as a function of time may be achieved by adjustment of the bias voltage on one or more aperture plates or zones of aperture plates as a function of time so that the number of ions passing through the aperture plate, assembly of aperture plates or aperture plate zones is varied as a function of time. This is referred to as "temporal adjustment" of the number ions delivered to the substrate.

In one embodiment according to the present invention, a plurality of electrical aperture plate bias sources is provided. An aperture plate having a plurality of aperture plate zones is provided in the process chamber, wherein at least two aperture plate zones of the plurality of aperture plate zones are operatively connected to a separate bias of the plurality of electrical aperture plate bias sources. The aperture plate can further comprise a plurality of apertures. At least one of the plurality of aperture plate zones can further comprise an annular geometry. The number of ions delivered to the substrate can be adjusted spatially and/or temporally for optimal performance by applying a separate bias voltage from the plurality of aperture plate bias sources to at least two aperture plate zones of the plurality of aperture plate zones during the plasma processing of the substrate. Further, the aperture plate can be actively cooled for a period of time during the plasma processing of the substrate and/or at least one aperture plate zone of the plurality of aperture plate zones can be grounded for a period of time during the plasma processing of the substrate.

In one embodiment according to the present invention, a plurality of electrical aperture plate bias sources is provided. A plurality of aperture plates is provided in the process chamber wherein at least one of the plurality of aperture plates having a plurality of aperture plate zones, wherein at least two aperture plate zones of the plurality of aperture plate zones are operatively connected to a separate bias of the plurality of electrical aperture plate bias sources. At least one of the plurality of aperture plates can further comprise a plurality of apertures. At least one of the plurality of aperture plate zones can further comprise an annular geometry. The number of ions delivered to the substrate can be adjusted spatially and/or temporally for optimal performance by applying a separate bias voltage from the plurality of electrical aperture plate bias sources to at least two aperture plate zones of the plurality of aperture plate zones during the plasma processing of the substrate. Further, at least one aperture plate zone of the plurality of aperture plate zones can be actively cooled for a period of time during the plasma processing of the substrate and/or at least one aperture plate zone of the plurality of aperture plate zones can be grounded for a period of time during the plasma processing of the substrate. Moreover, at least one of the plurality of aperture plates can be positioned non-planar to at least one of the plurality of aperture plates during the plasma processing of the substrate and/or at least one of the plurality of aperture plates can be positioned non-parallel to at least one of the plurality of aperture plates during the plasma processing of the substrate.

In one embodiment according to the present invention, an electrical aperture plate bias source is provided that is operatively connected to an aperture plate that is provided in the process chamber. The aperture plate can further comprise a plurality of apertures. The number of ions delivered to the substrate can be adjusted temporally for optimal performance by applying a time variable bias voltage from the electrical aperture plate bias source to the aperture plate during the plasma processing of the substrate. A "time variable" bias is a bias voltage that varies with time during the plasma processing of the substrate. The bias may vary linearly or non-linearly increasing or decreasing during the duration of the plasma processing. The polarity may remain constant or may be reversed once or more than once. It may vary in polarity according to the instantaneous voltage of an AC waveform or follow the magnitude only. It may comprise an AC waveform superimposed on a DC background. If an AC waveform, the frequency may remain constant or may vary with time. When the process conditions are changed at different stages of the process as it progresses in time, or individual parameter values change, the aperture plate bias may be adjusted in step with changes, as a more complex function of changes or out of phase with changes. The aperture plate bias may be held constant for periods of time but then varied at other times during the process. Further, the aperture plate can be actively cooled for a period of time during the plasma processing of the substrate and/or the aperture plate can be grounded for a period of time during the plasma processing of the substrate. Moreover, the plasma processing of the substrate can further comprise exposing the substrate to a plasma time division multiplex process which alternates between deposition and etching on the substrate.

In one embodiment according to the present invention, an electrical aperture plate bias source is provided. One or more of the aperture plates are operatively connected to the electrical aperture plate bias source. At least one of the plurality of aperture plates can further comprise a plurality of apertures. The number of ions delivered to the substrate can be adjusted temporally for optimal performance by applying a variable bias voltage from the electrical aperture plate bias source to at least one of the plurality of aperture plates during the plasma processing of the substrate wherein the bias voltage is varied as a function of time. Further, at least one of the plurality of aperture plates can be actively cooled for a period of time during the plasma processing of the substrate and/or at least one of the plurality of aperture plates can be grounded for a period of time during the plasma processing of the substrate. Moreover, at least one of the plurality of aperture plates can be positioned non-planar to at least one of the plurality of aperture plates during the plasma processing of the substrate and/or at least one of the plurality of aperture plates can be positioned non-parallel to at least one of the plurality of aperture plates during the plasma processing of the substrate. Also, the plasma processing of the substrate can further comprise exposing the substrate to a plasma time division multiplex process which alternates between deposition and etching on the substrate.

In one embodiment according to the present invention, a plurality of electrical aperture plate bias sources is provided. An aperture plate having a plurality of aperture plate zones is provided in the process chamber, wherein at least two aperture plate zones of the plurality of aperture plate zones are operatively connected to a separate bias of the plurality of electrical aperture plate bias sources. At least one of the plurality of aperture plate zones can further comprise an annular geometry. At least one of the plurality of aperture plates can further comprise a plurality of apertures. The number of ions delivered to the substrate can be adjusted spatially and/or temporally for optimal performance by applying a separate bias voltage from the plurality of electrical aperture plate bias sources to at least two aperture plate zones of the plurality of aperture plate zones during the plasma processing of the substrate. Further, at least one aperture plate zone of the plurality of aperture plate zones can be actively cooled for a period of time during the plasma processing of the substrate and/or at least one aperture plate zone of the plurality of aperture plate zones can be grounded for a period of time during the plasma processing of the substrate. Moreover, at least one of the plurality of aperture plates can be positioned non-planar to at least one of the plurality of aperture plates during the plasma processing of the substrate and/or at least one of the plurality of aperture plates can be positioned non-parallel to at least one of the plurality of aperture plates during the plasma processing of the substrate. Also, the plasma processing of the substrate can further comprise exposing the substrate to a plasma time division multiplex process which alternates between deposition and etching on the substrate.

In one embodiment according to the present invention, a plurality of electrical aperture plate bias sources is provided. A plurality of aperture plates having a plurality of aperture plate zones is provided in the process chamber, wherein at least two aperture plate zones of the plurality of aperture plate zones are operatively connected to a separate bias of the plurality of electrical aperture plate bias sources. At least one of the plurality of aperture plate zones can further comprise an annular geometry. At least one of the plurality of aperture plates can further comprise a plurality of apertures. The number of ions delivered to the substrate can be adjusted spatially and/or temporally for optimal performance by applying a separate bias voltage from the plurality of electrical aperture plate bias sources to at least two aperture plate zones of the plurality of aperture plate zones during the plasma processing of the substrate. Further, at least one aperture plate zone of the plurality of aperture plate zones can be actively cooled for a period of time during the plasma processing of the substrate and/or at least one aperture plate zone of the plurality of aperture plate zones can be grounded for a period of time during the plasma processing of the substrate. Moreover, at least one of the plurality of aperture plates can be positioned non-planar to at least one of the plurality of aperture plates during the plasma processing of the substrate and/or at least one of the plurality of aperture plates can be positioned non-parallel to at least one of the plurality of aperture plates during the plasma processing of the substrate. Also, the plasma processing of the substrate can further comprise exposing the substrate to a plasma time division multiplex process which alternates between deposition and etching on the substrate.

As shown in FIG. 1, the prior art teaches a process chamber 100 that is operatively connected to a plasma source 120 with a substrate support 130 that is positioned within the process chamber 100 for supporting a substrate 170. An aperture plate 190 having a plurality of apertures 195 is positioned within the process chamber 100. A substrate bias source 140 may be operatively connected to the substrate support 130. A gas supply 110 is operatively connected to the process chamber 100 and an exhaust 150 is operatively connected to the process chamber 100.

Figure 2:
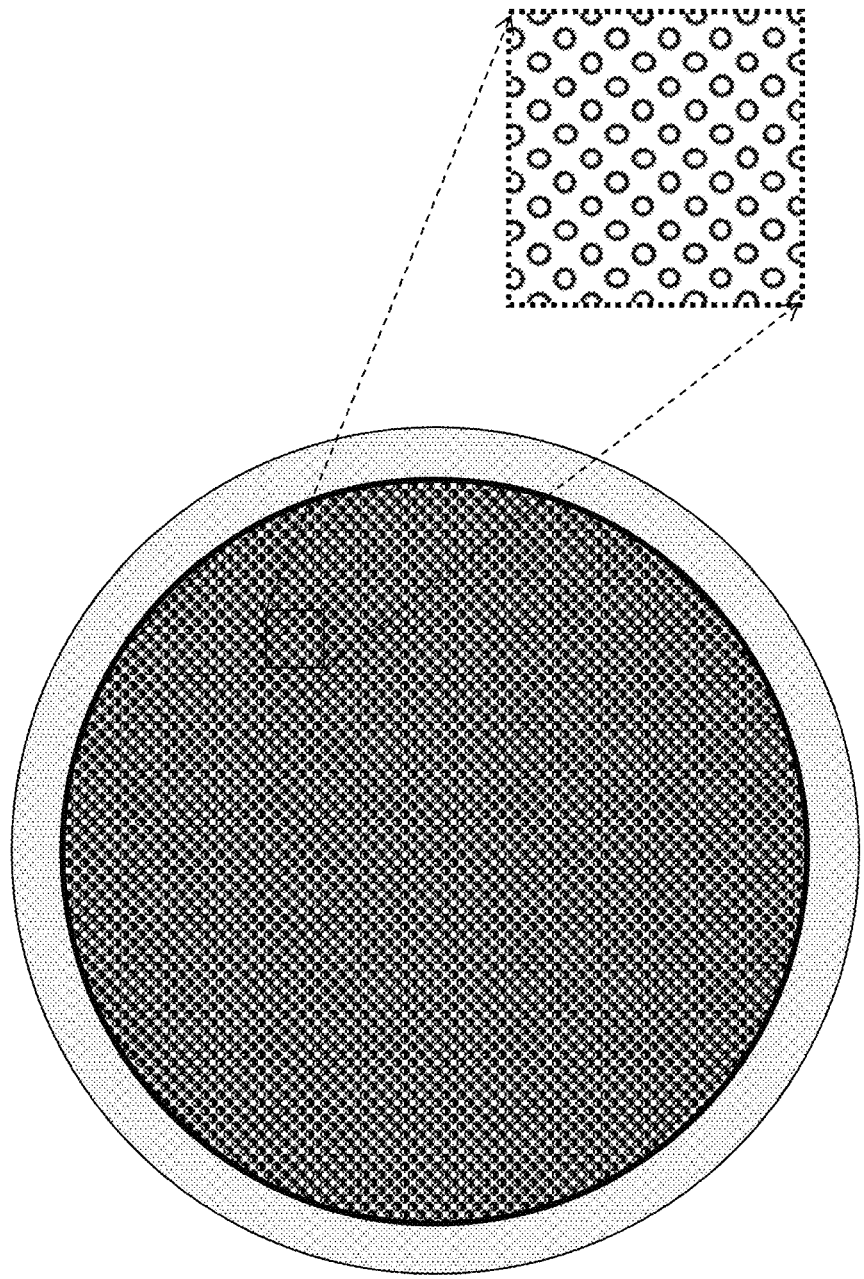
FIG. 2 is a view of an aperture plate with a magnified inset of an aperture geometry according to the prior art.

A prior art aperture plate is shown in FIG. 2 with an insert of a magnified view of the aperture geometry.

Figure 3:
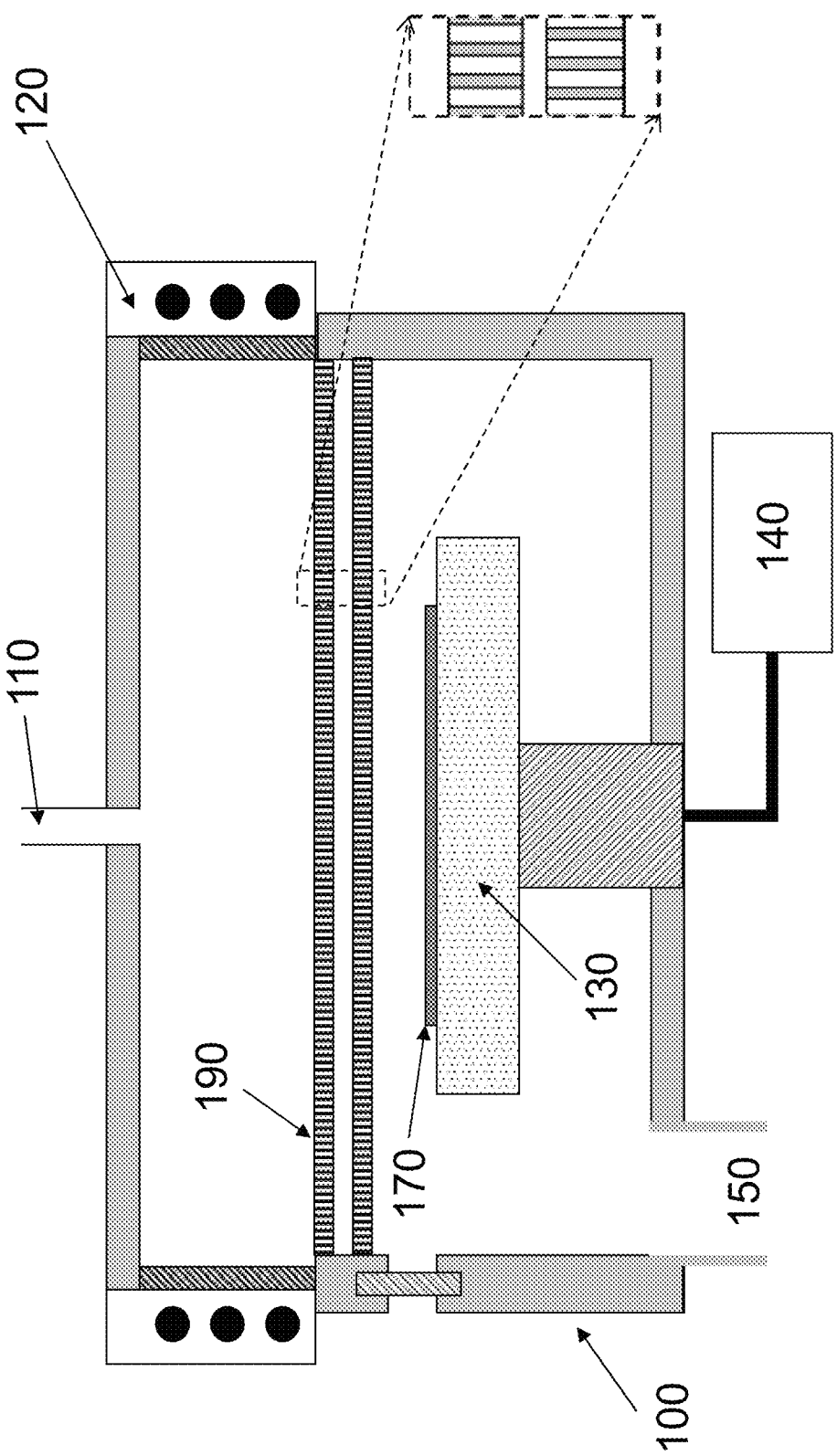
FIG. 3 is a schematic view of an ion filtering system according to one embodiment of the present invention.

As shown in FIG. 3, in one embodiment according to the present invention, a process chamber 100 that may be operatively connected to a plasma source 120 with a substrate support 130 that may be positioned within the process chamber 100 for supporting a substrate 170. In addition, a plurality of aperture plates 190 having a plurality of apertures that are aligned with one another is shown. A substrate bias source 140 may be operatively connected to the substrate support 130. A gas supply 110 may be operatively connected to the process chamber 100 and an exhaust 150 may be operatively connected to the process chamber 100.

Figure 4:
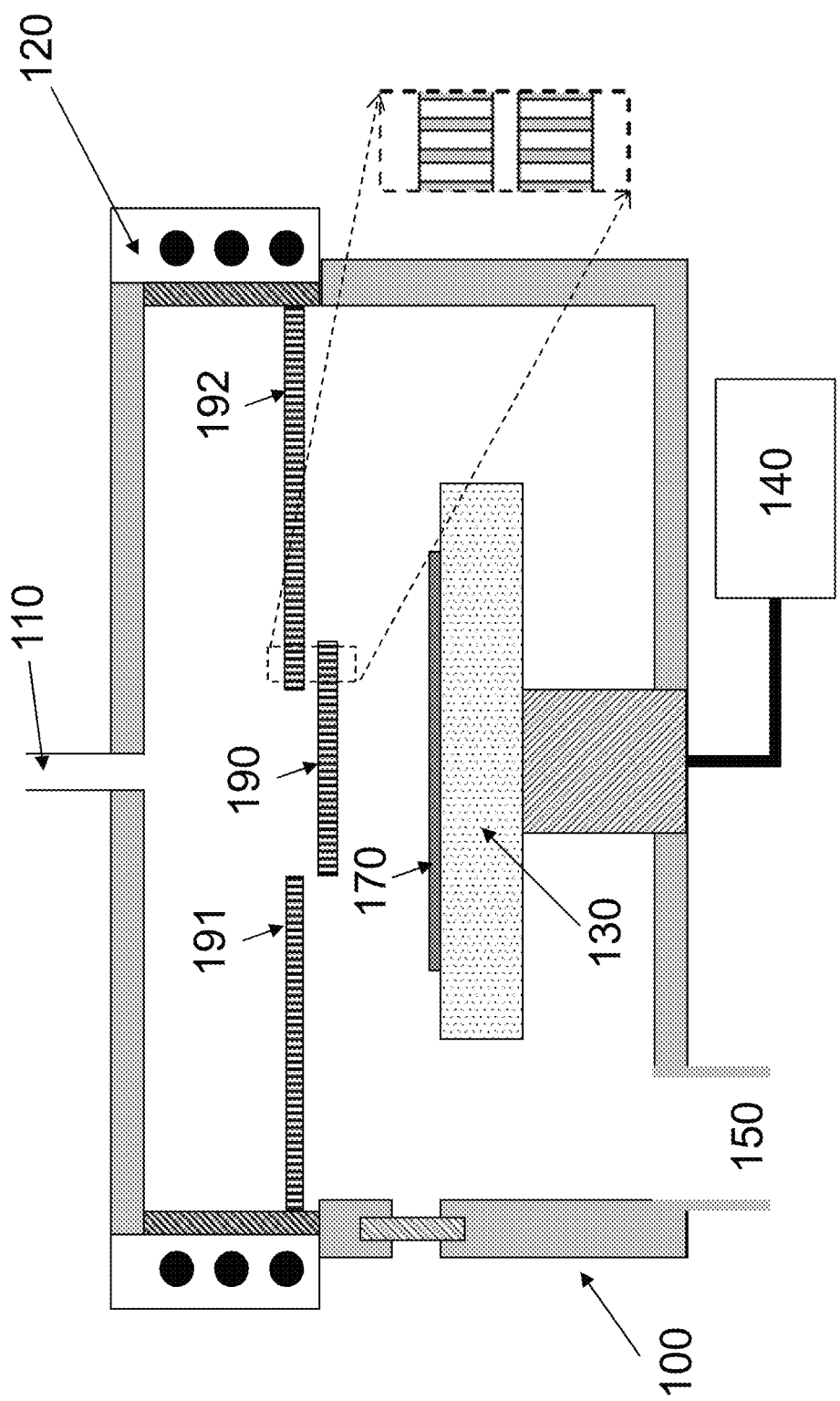
FIG. 4 is a schematic view of an ion filtering system according to one embodiment of the present invention.

As shown in FIG. 4, in one embodiment according to the present invention, a process chamber 100 that may be operatively connected to a plasma source 120 with a substrate support 130 that may be positioned within the process chamber 100 for supporting a substrate 170. In addition, a plurality of aperture plates 190, 191, 192 having a plurality of apertures is shown. The aperture plates can be offset to one another. The aperture plates 190, 192 can overlap. In regions where the aperture plates 190, 191, 192 overlap, some apertures in the overlap region can overlap other apertures. Some apertures in the overlap region may not overlap another aperture. A substrate bias source 140 can be operatively connected to the substrate support 130. A gas supply 110 may be operatively connected to the process chamber 100 and an exhaust 150 may be operatively connected to the process chamber 100.

Figure 5:
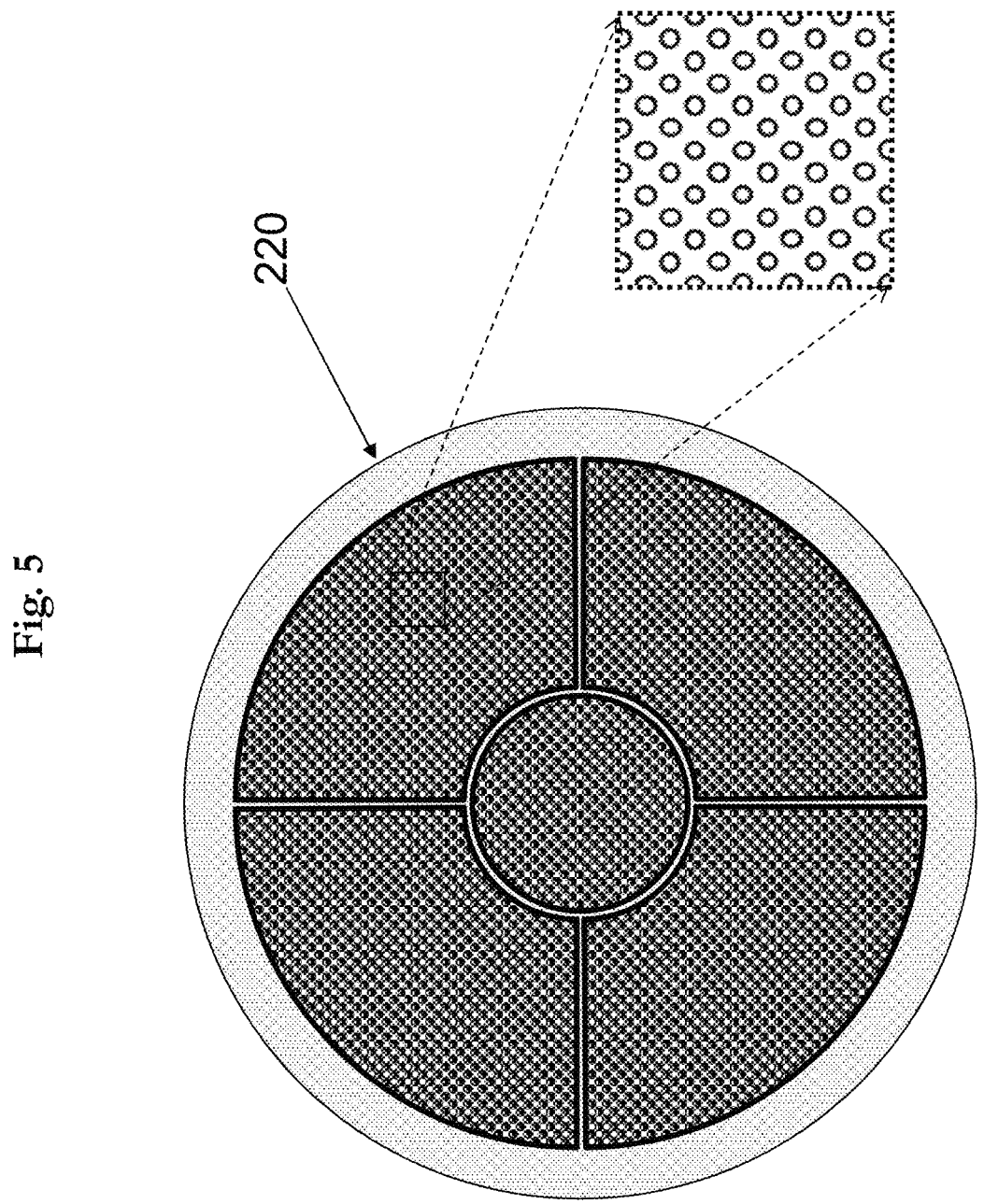
FIG. 5 shows an aperture plate and a magnified view of an option for the geometry of the aperture plate configuration according to one embodiment of the present invention.

FIG. 5 shows an aperture plate 220 and a magnified view of an option for the geometry of an aperture plate zone. The aperture plate 220 having a plurality of aperture plate zones according to one embodiment of the present invention.

Figure 6:
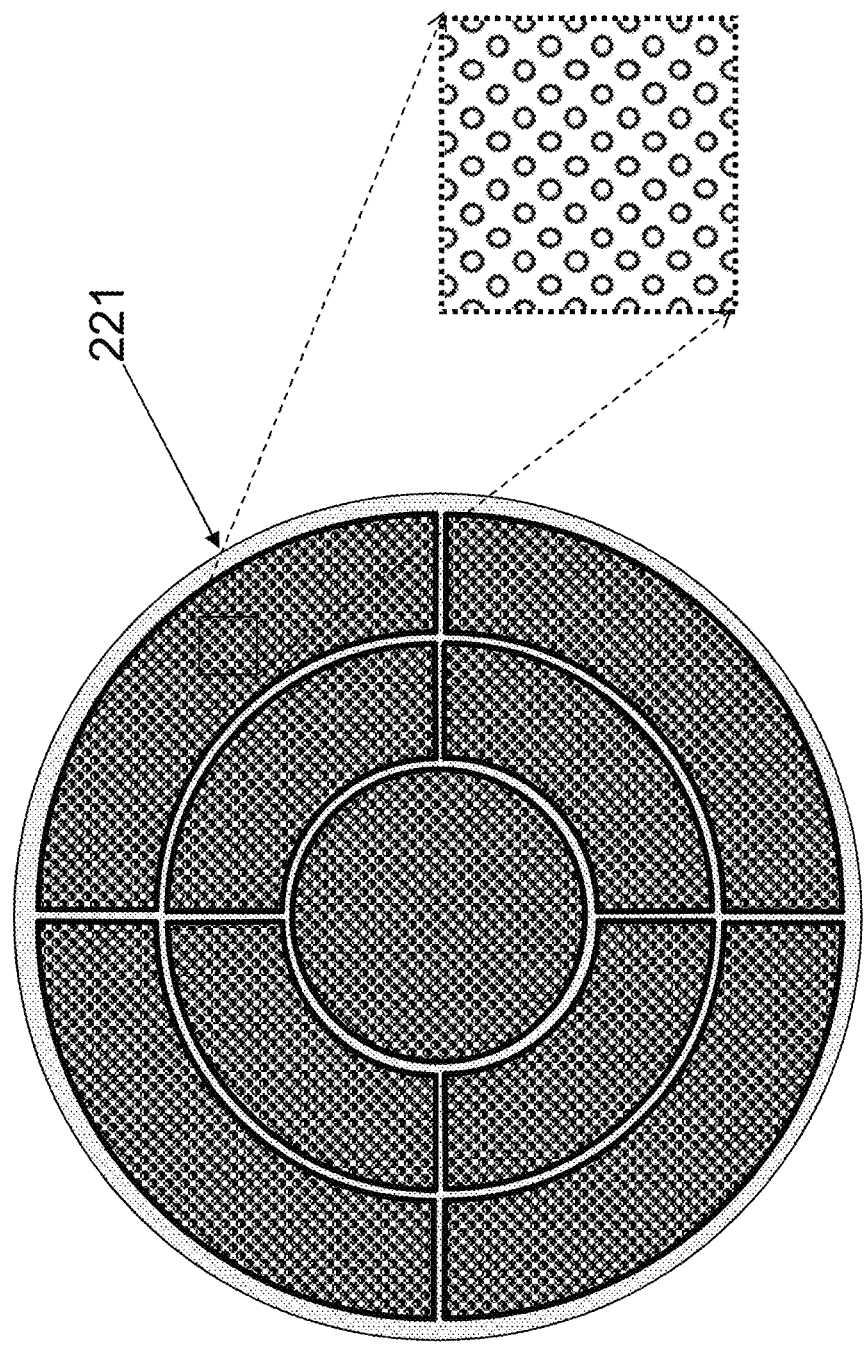
FIG. 6 shows an aperture plate and a magnified view of an option for the geometry of the aperture plate configuration according to one embodiment of the present invention.

FIG. 6 shows an aperture plate 221 and a magnified view of an option for the geometry of an aperture plate zone. The aperture plate 221 having a plurality of aperture plate zones according to one embodiment of the present invention.

Figure 7:
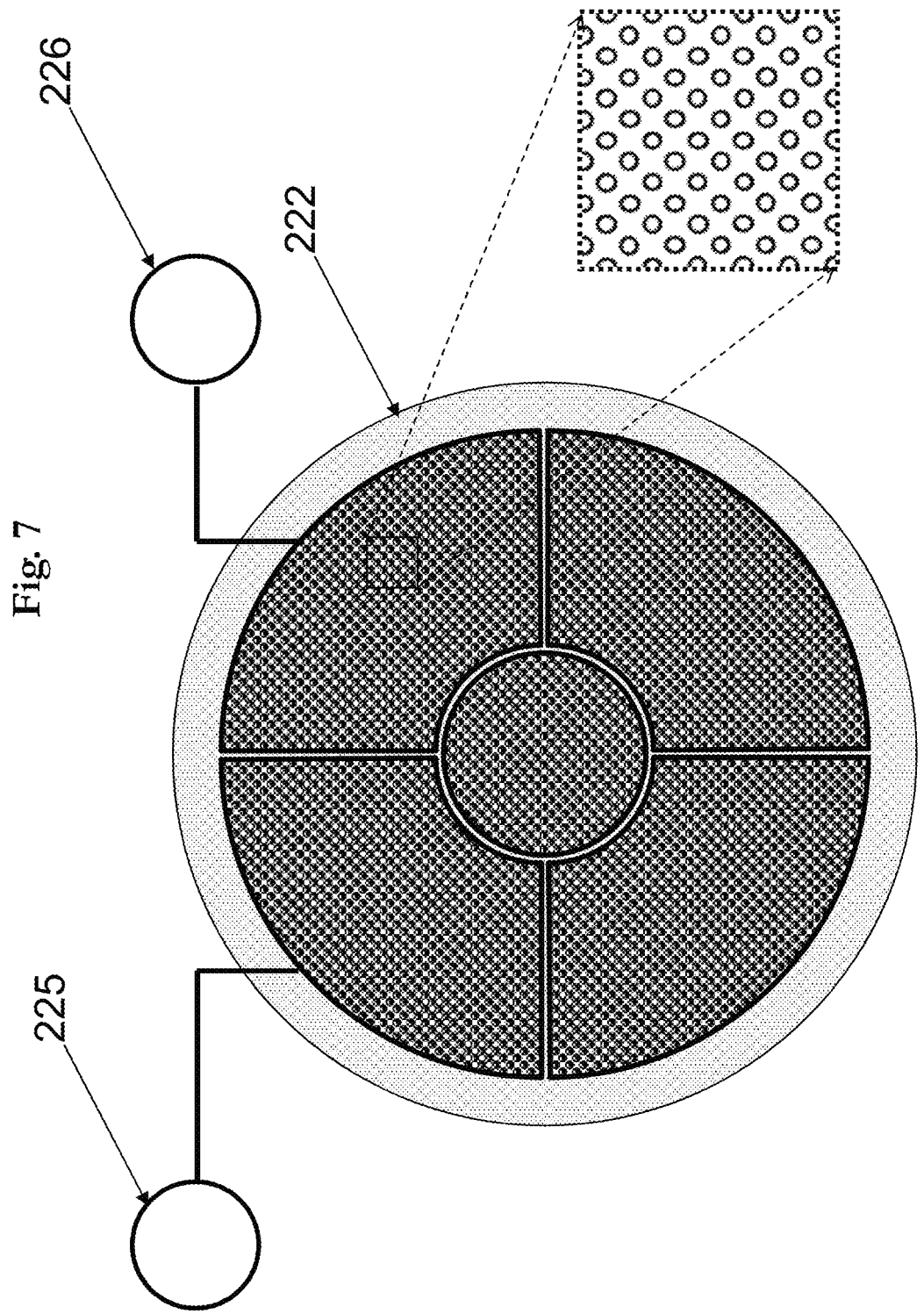
FIG. 7 shows an aperture plate and a magnified view of an option for the geometry of the aperture plate configuration according to one embodiment of the present invention.

FIG. 7 shows an aperture plate 222 and a magnified view of an option for the geometry of an aperture plate zone. The aperture plate 222 having a plurality of aperture plate zones according to one embodiment of the present invention. In addition, FIG. 7 shows one aperture plate bias 225 being operatively connected to one of the plurality of aperture plate zones and another aperture plate bias 226 being operatively connected to another one of the plurality of aperture plate zones.

Figure 8:
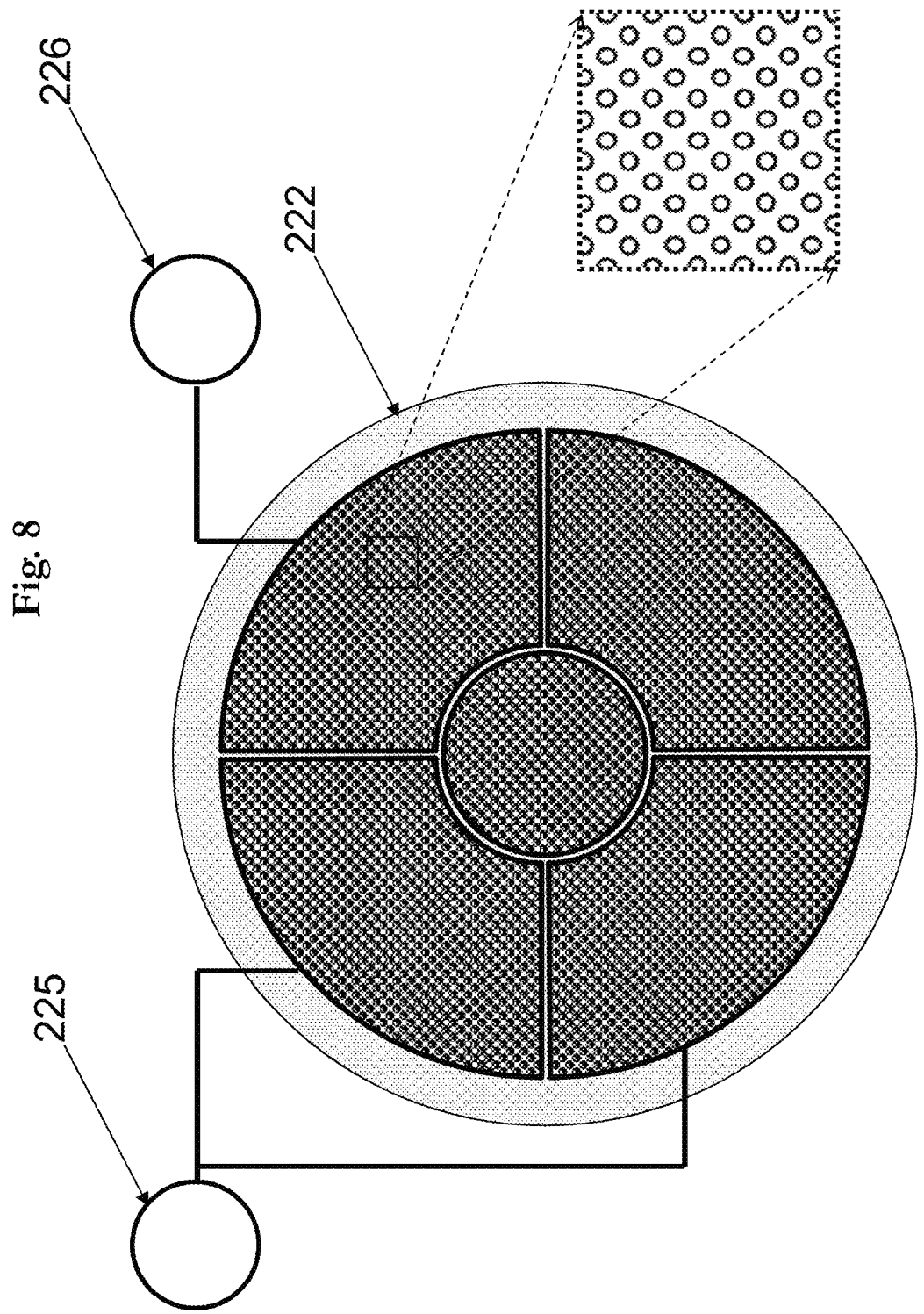
FIG. 8 shows an aperture plate and a magnified view of an option for the geometry of the aperture plate configuration according to one embodiment of the present invention.

FIG. 8 shows an aperture plate 222 and a magnified view of an option for the geometry of an aperture plate zone. The aperture plate 222 having a plurality of aperture plate zones according to one embodiment of the present invention. In addition, FIG. 8 shows one aperture plate bias 225 being operatively connected to more than one of the plurality of aperture plate zones and another aperture plate bias 226 being operatively connected to another one of the plurality of aperture plate zones.

Figure 9:
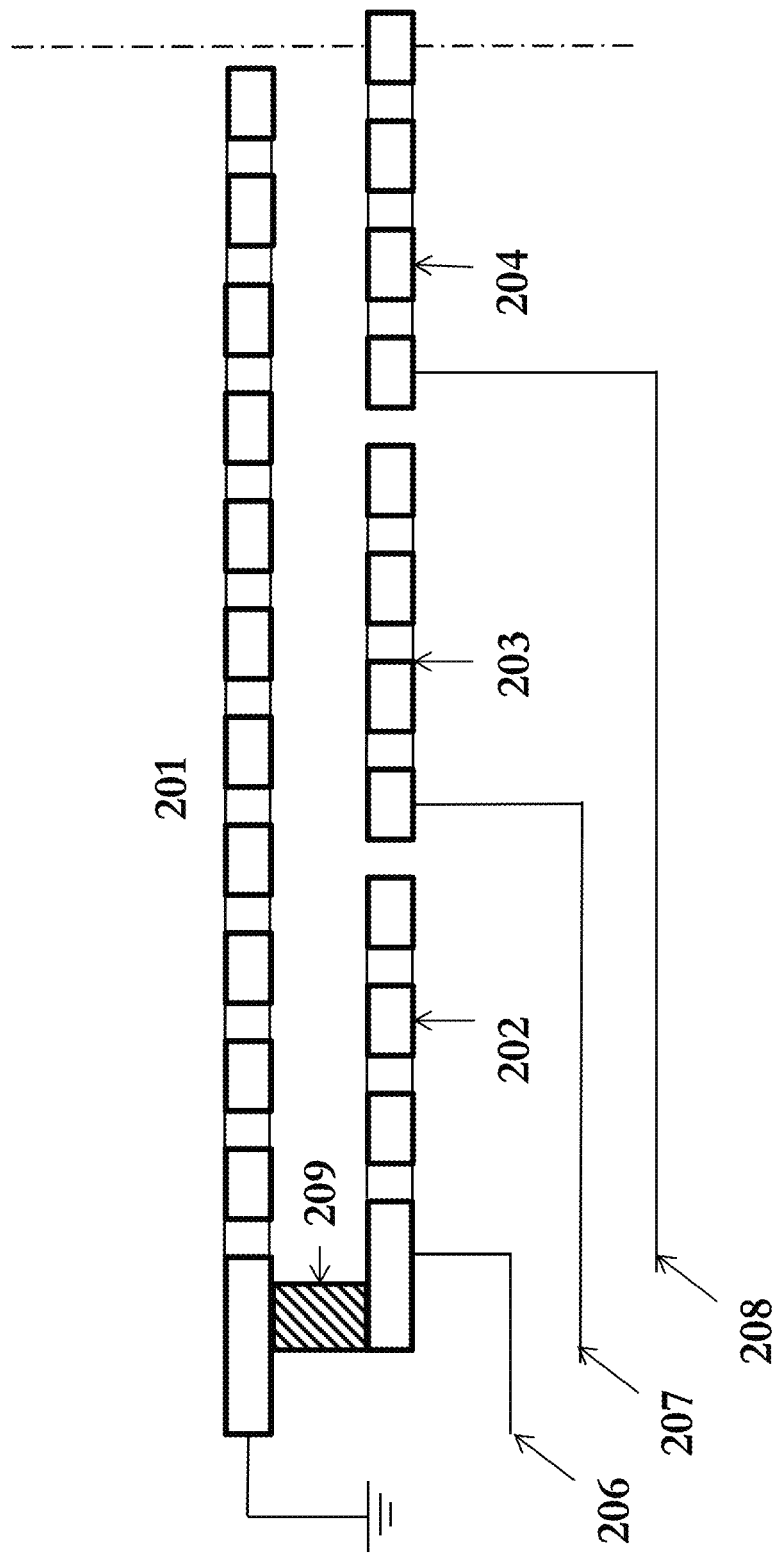
FIG. 9 shows three zones of an aperture plate being biased according to one embodiment of the present invention.

As shown in FIG. 9, a plurality of electrical aperture plate bias sources are each operatively connected to a separate aperture plate zone. FIG. 9 shows a plurality of electrical aperture plate bias sources 206, 207, 208 operatively connected to separate aperture plate zones 202, 203, 204 of a plurality of aperture zones of the aperture plate according to one embodiment of the present invention. A representative electrical insulating component 209 is shown that may be used to support and maintain the spacing between the aperture plates while allowing a potential difference to be applied between aperture plates or zones of aperture plates.

Figure 10:
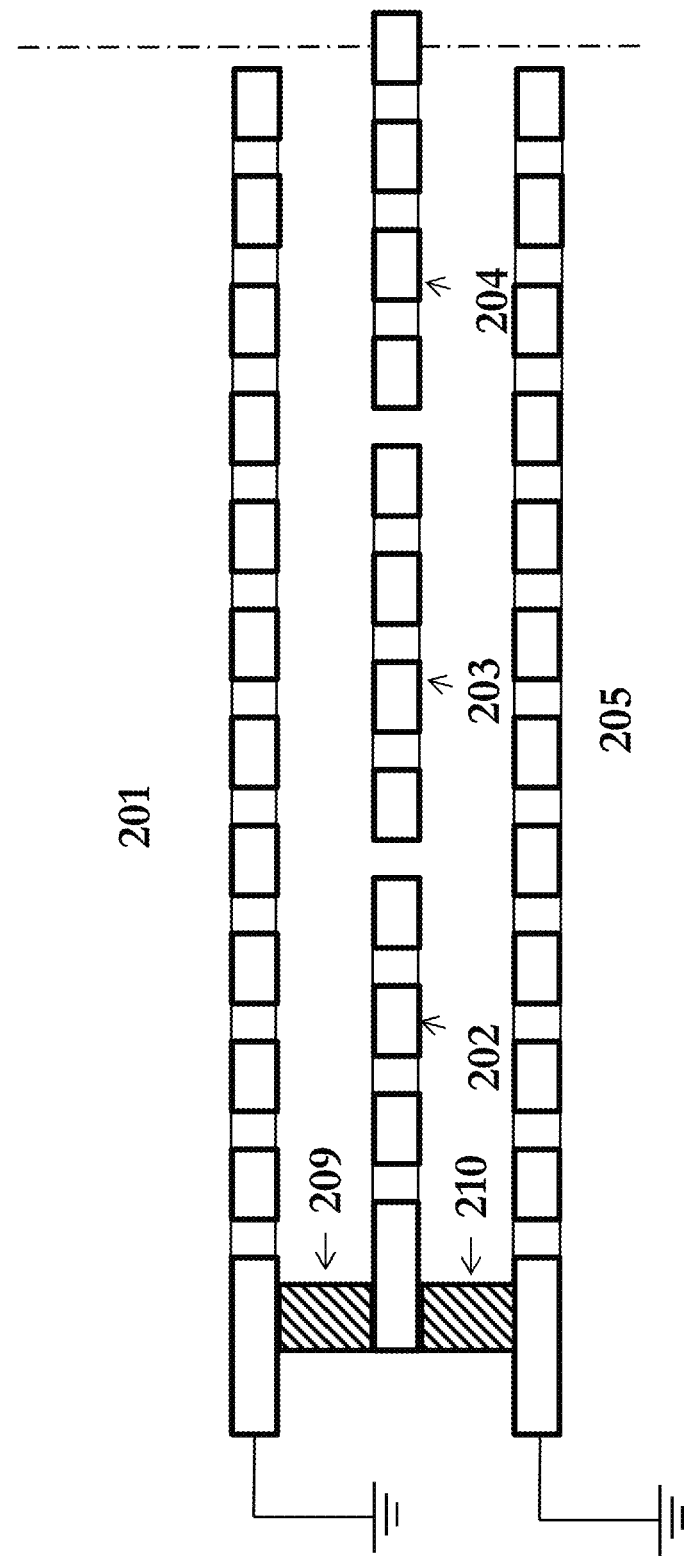
FIG. 10 shows three zones of an aperture plate being biased according to one embodiment of the present invention.
Figure 11:
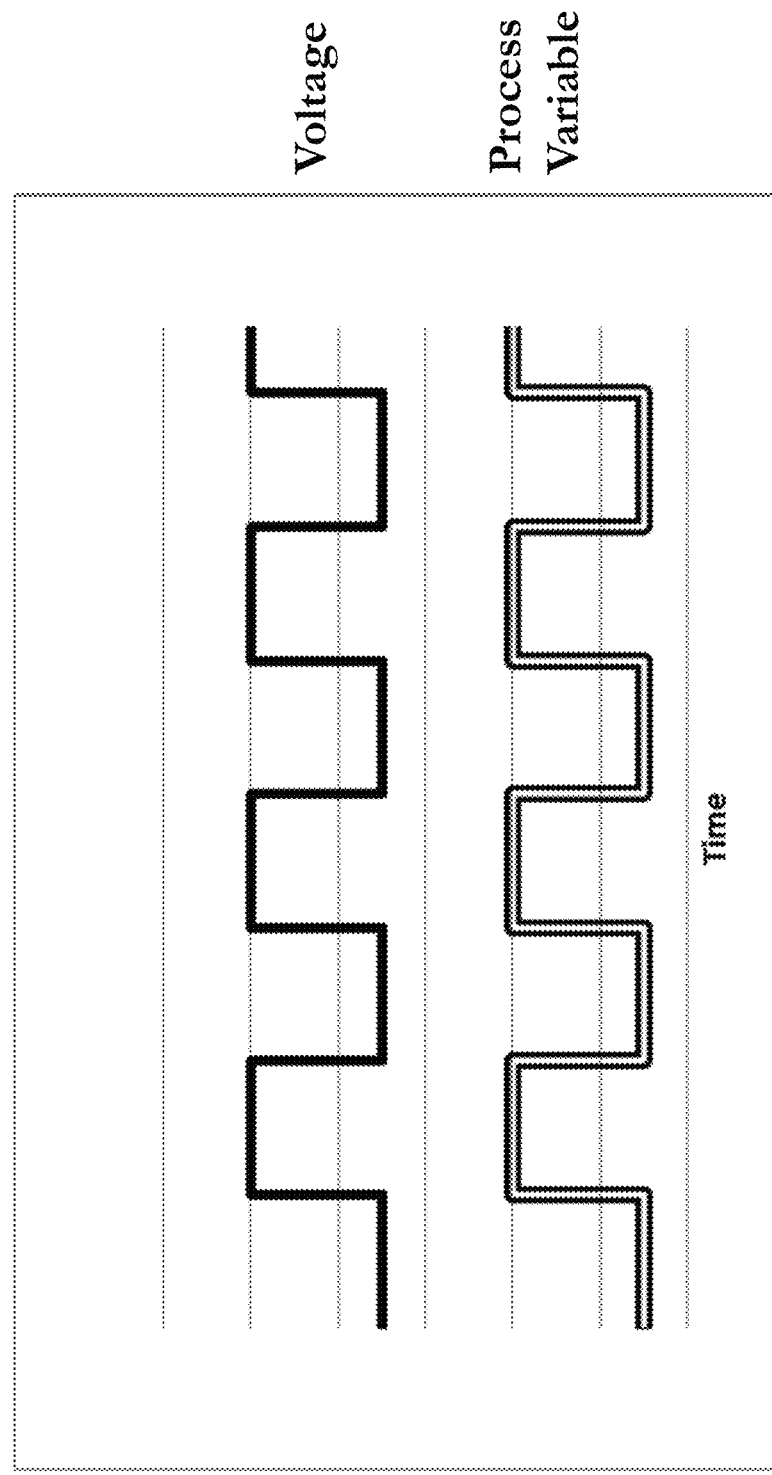
FIG. 11 is a plot of voltage vs. time referenced to a process variable according to one embodiment of the present invention.
Figure 12:
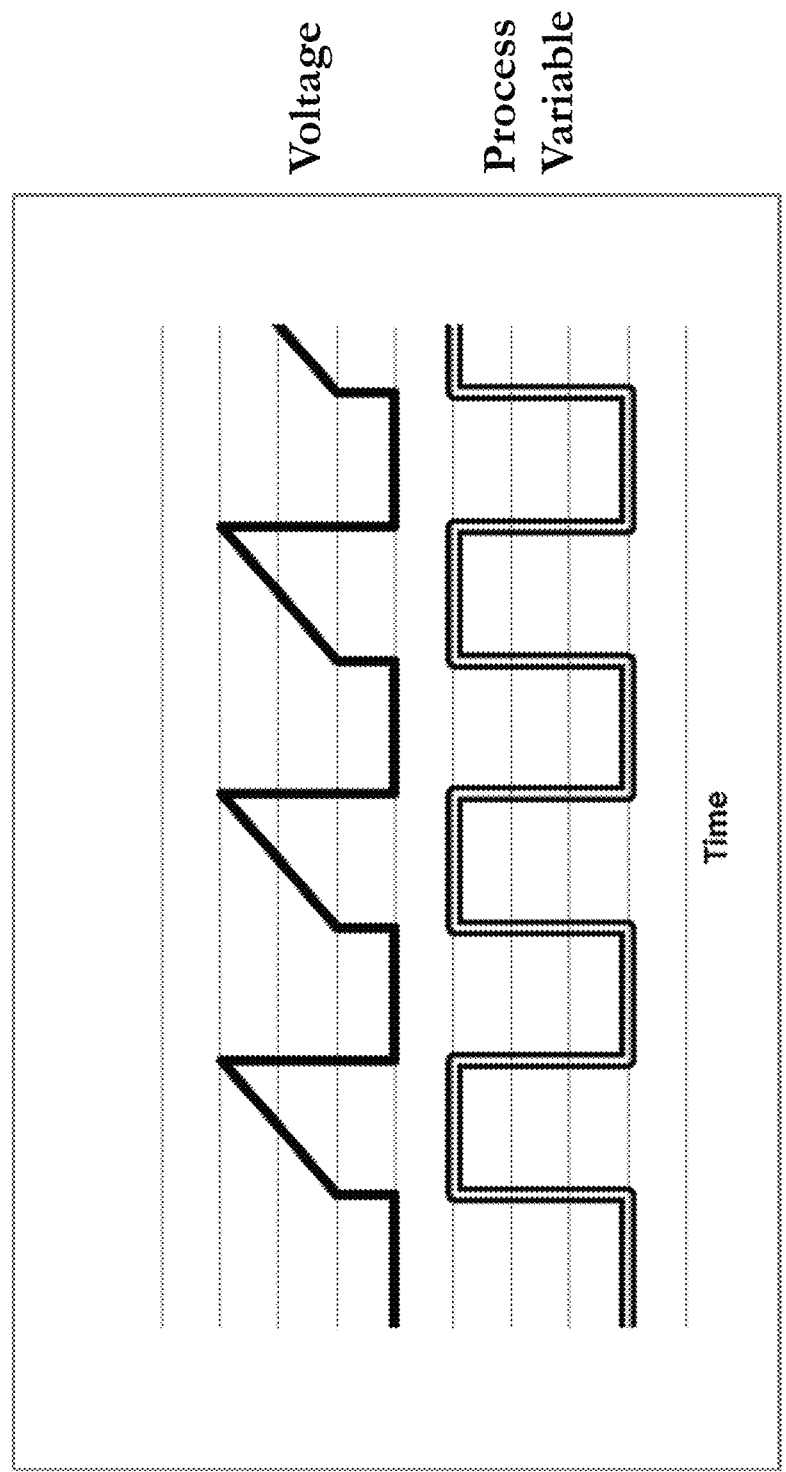
FIG. 12 is a plot of voltage vs. time referenced to a process variable according to one embodiment of the present invention.
Figure 13:
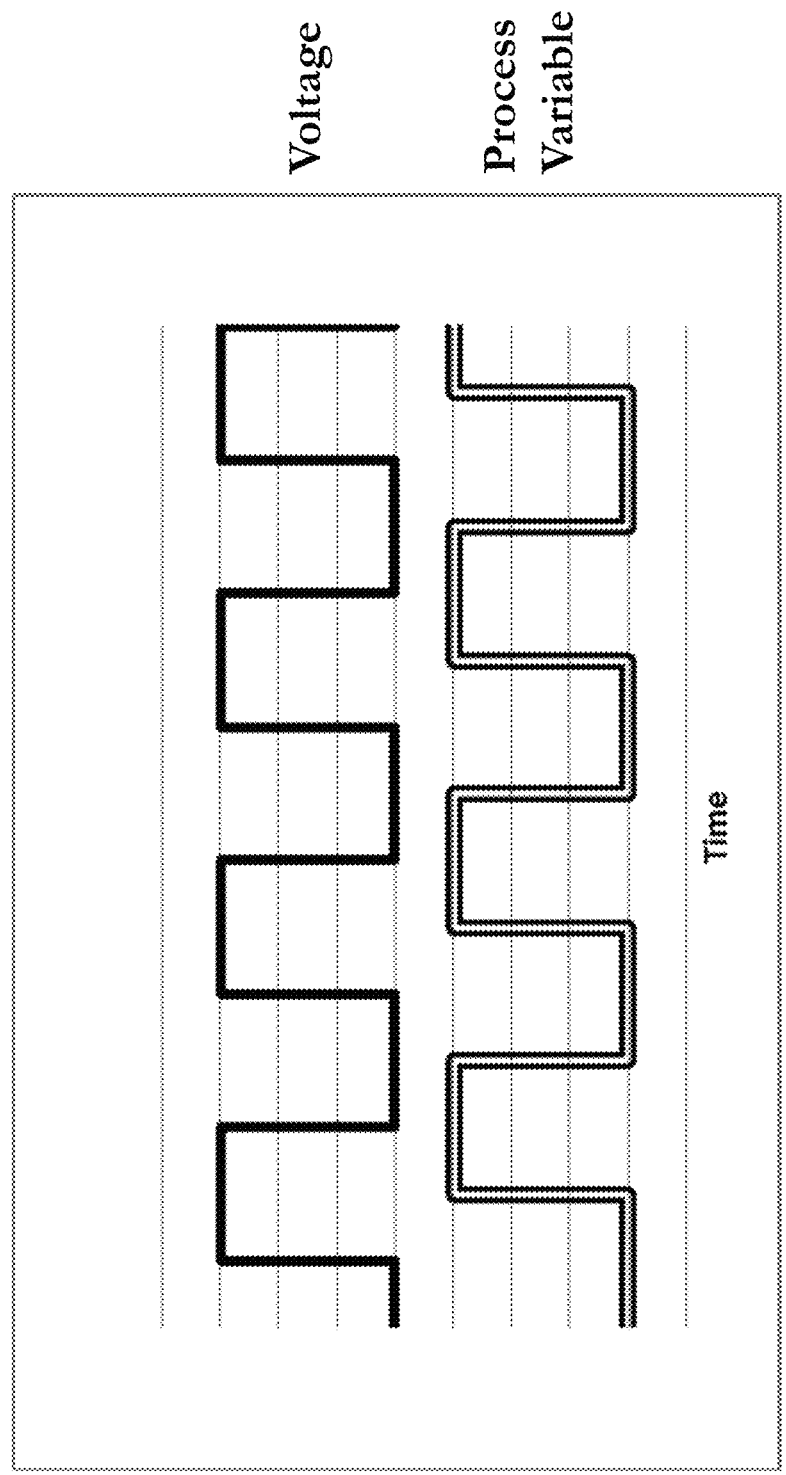
FIG. 13 is a plot of voltage vs. time referenced to a process variable according to one embodiment of the present invention.
Figure 14:
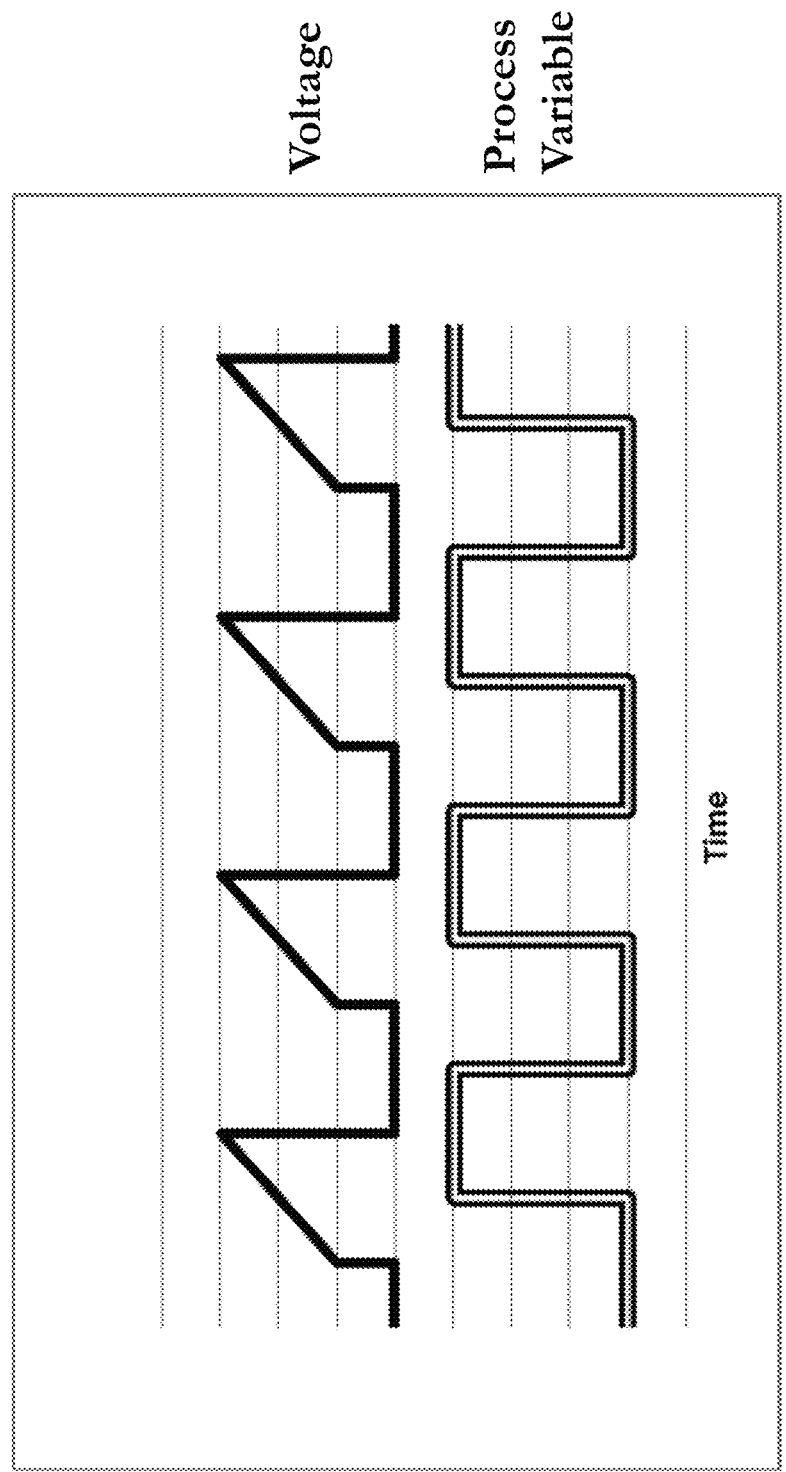
FIG. 14 is a plot of voltage vs. time referenced to a process variable according to one embodiment of the present invention.
Figure 15:
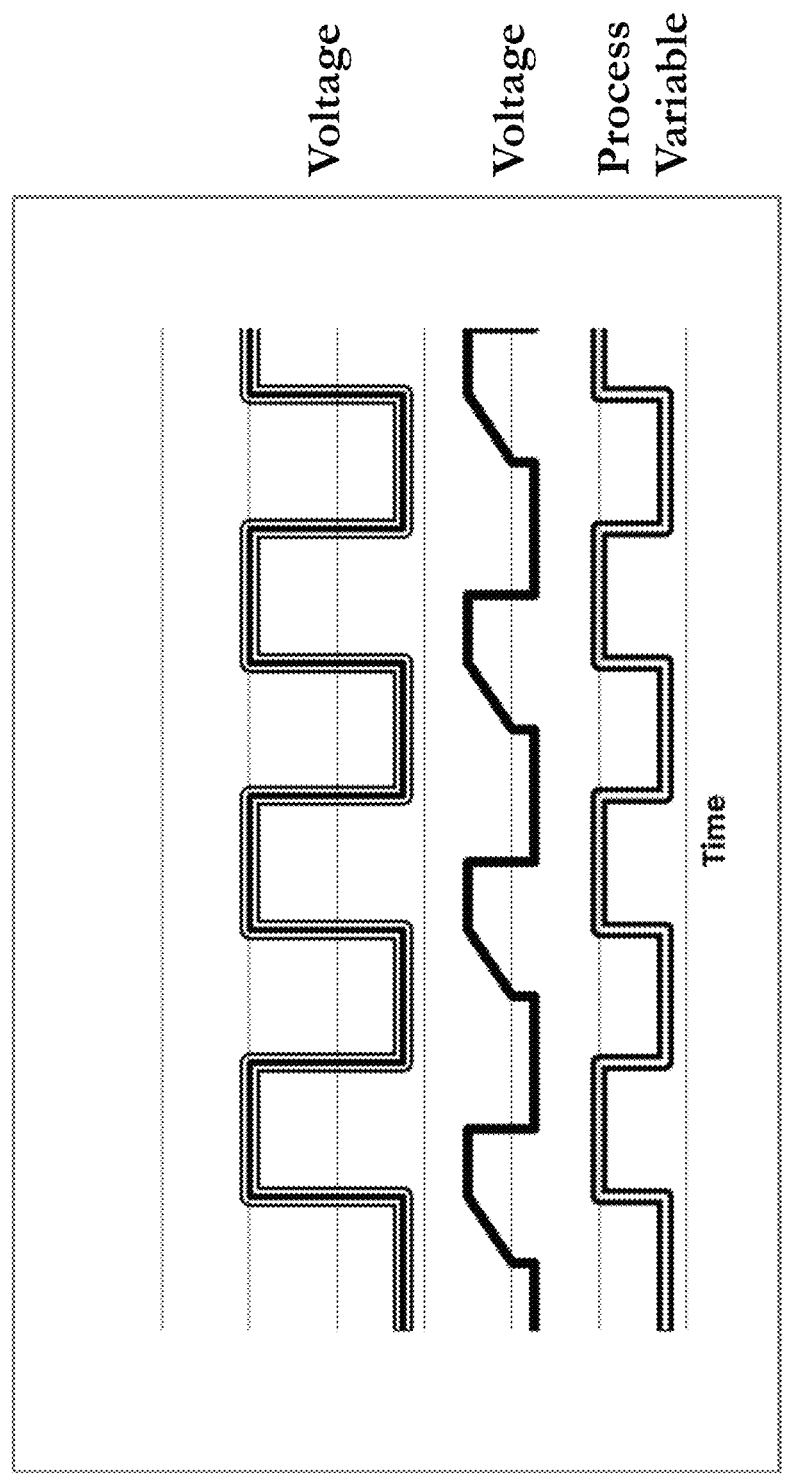
FIG. 15 is a plot of voltage vs. time referenced to a process variable according to one embodiment of the present invention.

As shown in FIG. 10, a group of aperture plates, with at least one aperture plate having a plurality of aperture plate zones 202, 203, 204. A plurality of electrical aperture plate bias sources 206, 207, 208 are each operatively connected to at least one aperture plate zone of an aperture plate that has a plurality of aperture zones according to one embodiment of the present invention. FIG. 10 also shows a grounded aperture plate. Representative electrical insulating components 209, 210 are shown that may be used to support and maintain the spacing between the aperture plates while allowing a potential difference to be applied between aperture plates or zones of aperture plates.

FIGS. 11 to 15 show plots of aperture plate bias voltage vs. time referenced to changes in a process variable. Specifically, the bias applied to an aperture plate or one of a number of aperture plates or an aperture plate zone of an aperture plate may be applied in time such as to be synchronous with changes in a process parameter or shifted in time with respect to changes in a process parameter or reflecting only some changes in the process parameter. Each plot of FIGS. 11 to 15 shows an embodiment according to the present invention. A process variable can include process set points and/or systems responses. Process set points can include RF power, process pressure, gas flows, and/or gas compositions. Process set points can be recipe defined. System responses can be measurable responses from the system. System responses can include throttle valve position, matching network variable capacitor positions, RF reflected power, etc. Systems responses can also include process measurements such as plasma density, plasma intensity, plasma composition (e.g. through emission spectroscopy), and/or measurements of substrate properties (e.g. film thickness, etch depth, etc.). The process measurements can be taken in-situ during the process. An aperture plate bias voltage can be synchronous or asynchronous with a process variable. An aperture plate bias voltage can be in phase or out of phase with a process variable. While the figures show voltage curves of similar frequency to a process variable, a voltage curve can be at a different frequency than any or all process variables.

In any embodiment of the present invention, at least one of the aperture plates can be planar or non-planar. An aperture plate can be parallel to the substrate or the aperture plate can be non-parallel to the substrate. An aperture plate can be domed. An aperture plate can consist of a single material or multiple materials. An aperture plate can be partially or completely conductive; partially or completely dielectric; and/or partially or completely semiconducting.

In any embodiment of the present invention, all aperture plates can be the same size or at least one aperture plate can be a different size from the other aperture plates. All aperture plates can be the same shape or at least one plate can be a different shape from the other aperture plates. At least a portion of two aperture plates can be non-coplanar or all aperture plates can be non-coplanar. At least a portion of two aperture plates can be co-planar or all plates can be co-planar. At least a portion of two aperture plates can be parallel or at least a portion of two aperture plates can be non-parallel. No aperture plates can overlap or at least a portion of two aperture plates can overlap. At least one aperture within a plate can overlap an aperture in a second plate or more than one aperture can overlap or all apertures can overlap one another. At least one aperture within a plate cannot overlap an aperture in a second plate or more than one aperture cannot overlap or no apertures can overlap one another. At least one aperture plate can be completely overlapped by a second aperture plate or all aperture plates can overlap.

In any embodiment of the present invention, at least one aperture plate can be electrically isolated from a second plate or more than two aperture plates can be electrically isolated from each other or all aperture plates electrically isolated from each other. At least one aperture plate can be electrically connected to a second plate or more than two aperture plates can be electrically connected to each other or all aperture plates can be electrically connected to each other. At least one aperture plate can be isolated from ground or more than one aperture plate can be isolated from ground or all aperture plates can be isolated from ground. At least one aperture plate can be grounded or more than one aperture plate can be grounded or all aperture plates can be grounded. At least one aperture plate can be divided into more than one aperture plate zones or more than one aperture plate can have multiple zones or all aperture plates can have multiple zones.

In any embodiment of the present invention, the apertures in different aperture plates, within an aperture plate, between different aperture plate zones and/or within an aperture plate zone can be the same size, shape and/or aspect ratio or a variety of sizes, shapes and/or aspect ratios.

In any embodiment of the present invention, a voltage can be applied to at least one aperture plate. The voltage can be AC or DC or a combination of both. The voltages applied to different aperture plates, within an aperture plate, between different aperture plate zones and/or within an aperture plate zone can be the same or may vary with respect to amplitude, frequency and/or phase during some portion of the process.

Any aperture plate, or aperture plate zone may be grounded for some portion of the process In any embodiment of the present invention, more than one aperture can overlap the substrate. The aperture plate can be divided into more than one aperture plate zone or at least two aperture plate zones that are electrically isolated from each other or all aperture plate zones can be electrically isolated from each other. At least two aperture plate zones can be electrically connected to each other or all aperture plate zones can be electrically connected to each other. At least two aperture plate zones can be the same shape or all aperture plate zones can be the same shape. At least two aperture plate zones can be a different shape or all aperture plate zones can be a different shape. All aperture plate zones can be the same size or at least two aperture plate zones can be a different size. At least one aperture plate zone can be electrically grounded. A voltage can be applied to at least one aperture plate zone or a voltage can be applied to more than one aperture plate zone or a voltage can be applied to all aperture plate zones. The same voltage can be applied to all aperture plate zones or at least two aperture plate zones can have a different voltage or a different voltage for at least a portion of the plasma process or a different voltage for the entire plasma process.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A method for using ion filtering to adjust the number of ions delivered to a substrate, the method comprising:
    providing a process chamber;
    providing a plasma source operatively connected to the process chamber;
    providing a substrate support within the process chamber;
    providing the substrate onto the substrate support;
    providing a plurality of electrical bias sources;
    providing a first aperture plates having a first plurality of apertures and a first plurality of aperture plate zones in the process chamber, providing a second aperture plate having a second plurality of apertures and a second plurality of aperture plate zones in the process chamber;
    generating a plasma using the plasma source;
    processing the substrate on the substrate support using the generated plasma while said first aperture plate and said second aperture plate are positioned between the plasma source and the substrate, while a first portion of the first plurality of apertures of said first aperture plate are aligned with a second portion of the second plurality of apertures of said second aperture plate, while at least one aperture on said first aperture plate does not overlap any aperture on said second aperture plate, while said first aperture plate is adjacent to said second aperture plate, and while no other aperture plate is between said first aperture plate and said second aperture plate; and
    applying a separate bias voltage from the plurality of electrical bias sources to at least two aperture plate zones of the plurality of aperture plate zones of said first aperture plate and at least two aperture plate zones of the plurality of aperture plate zones of said second aperture plate during the plasma processing of the substrate.

2. The method according to claim 1, wherein at least one aperture plate zone of the plurality of aperture plate zones is grounded for a period of time during the plasma processing of the substrate.

3. A method for using ion filtering to adjust the number of ions delivered to a substrate, the method comprising:
    providing a process chamber;
    providing a plasma source operatively connected to the process chamber;
    providing a substrate support within the process chamber;
    providing the substrate onto the substrate support;
    providing an electrical bias source;
    providing a first aperture plates having a first plurality of apertures in the process chamber, providing a second aperture plate having a second plurality of apertures in the process chamber;
    generating a plasma using the plasma source;
    processing the substrate on the substrate support using the generated plasma while said first aperture plate and said second aperture plate are positioned between the plasma source and the substrate, while a first portion of the first plurality of apertures of said first aperture plate are aligned with a second portion of the second plurality of apertures of said second aperture plate, while at least one aperture on said first aperture plate does not overlap any aperture on said second aperture plate, while said first aperture plate is adjacent to said second aperture plate, and while no other aperture plate is between said first aperture plate and said second aperture plate; and
    applying variable bias voltage from the electrical bias source to at least one of the plurality of aperture plates, said bias voltage being varied as a function of time during the plasma processing of the substrate.

4. The method according to claim 3, wherein the substrate further comprising a semiconductor wafer on tape on a frame.

5. The method according to claim 3, wherein at least one of the plurality of aperture plates is actively cooled for a period of time during the plasma processing of the substrate.

6. The method according to claim 3, wherein at least one of the plurality of aperture plates is grounded for a period of time during the plasma processing of the substrate.

7. The method according to claim 3, wherein at least one of the plurality of aperture plates is positioned non-planar to at least one of the plurality of aperture plates during the plasma processing of the substrate.

8. The method according to claim 3, wherein at least one of the plurality of aperture plates is positioned non-parallel to at least one of the plurality of aperture plates during the plasma processing of the substrate.

9. The method according to claim 3, wherein the plasma processing of the substrate further comprising exposing the substrate to a plasma time division multiplex process which alternates between deposition and etching on the substrate.

10. A method for using ion filtering to adjust the number of ions delivered to a substrate, the method comprising:
    providing a process chamber;
    providing a plasma source operatively connected to the process chamber;
    providing a substrate support within the process chamber;
    providing the substrate onto the substrate support;
    providing a plurality of electrical bias sources;

providing a first aperture plates having a first plurality of apertures and a first plurality of aperture plate zones in the process chamber, providing a second aperture plate having a second plurality of apertures and a second plurality of aperture plate zones;

generating a plasma using the plasma source;

processing the substrate on the substrate support using the generated plasma while said first aperture plate and said second aperture plate are positioned between the plasma source and the substrate, while a first portion of the first plurality of apertures of said first aperture plate are aligned with a second portion of the second plurality of apertures of said second aperture plate, while at least one aperture on said first aperture plate does not overlap any aperture on said second aperture plate, while said first aperture plate is adjacent to said second aperture plate, and while no other aperture plate is between said first aperture plate and said second aperture plate; and applying a separate bias voltage from the plurality of electrical bias sources to at least two aperture plate zones of the plurality of aperture plate zones of said first aperture plate and at least two aperture plate zones of the plurality of aperture plate zones of said second aperture plate during the plasma processing of the substrate, at least one bias voltage being varied as a function of time during the plasma processing of the substrate.

11. The method according to claim 10, wherein at least one of the plurality of aperture plate zones further comprising an annular geometry.

12. The method according to claim 10, wherein the substrate further comprising a semiconductor wafer on tape on a frame.

13. The method according to claim 10, wherein at least one aperture plate zone of the plurality of aperture plate zones is actively cooled for a period of time during the plasma processing of the substrate.

14. The method according to claim 10, wherein at least one aperture plate zone of the plurality of aperture plate zones is grounded for a period of time during the plasma processing of the substrate.

15. The method according to claim 10, wherein at least one of the plurality of aperture plates is positioned non-planar to at least one of the plurality of aperture plates during the plasma processing of the substrate.

16. The method according to claim 10, wherein at least one of the plurality of aperture plates is positioned non-parallel to at least one of the plurality of aperture plates during the plasma processing of the substrate.

17. The method according to claim 10, wherein the plasma processing of the substrate further comprising exposing the substrate to a plasma time division multiplex process which alternates between deposition and etching on the substrate.

* * * * *

UNITED STATES PATENT AND TRADEMARK OFFICE
CERTIFICATE OF CORRECTION

| | |
|---|---|
| PATENT NO. | : 11,747,494 B2 |
| APPLICATION NO. | : 16/907503 |
| DATED | : September 5, 2023 |
| INVENTOR(S) | : Lea et al. |

It is certified that error appears in the above-identified patent and that said Letters Patent is hereby corrected as shown below:

In the Claims

Column 15, Lines 35-44 Claim 1 should be corrected as follows:
1. A method for using ion filtering to adjust the number of ions delivered to a substrate, the method comprising: providing a process chamber; providing a plasma source operatively connected to the process chamber; providing a substrate support within the process chamber; providing the substrate onto the substrate support; providing a plurality of electrical bias sources; providing a first aperture plate ...

Column 16, Lines 8-17 Claim 3 should be corrected as follows:
3. A method for using ion filtering to adjust the number of ions delivered to a substrate, the method comprising: providing a process chamber; providing a plasma source operatively connected to the process chamber; providing a substrate support within the process chamber; providing the substrate onto the substrate support; providing an electrical bias source; providing a first aperture plate ...

Column 16, Line 60-Column 17, Line 1 Claim 10 should be corrected as follows:
10. A method for using ion filtering to adjust the number of ions delivered to a substrate, the method comprising: providing a process chamber; providing a plasma source operatively connected to the process chamber; providing a substrate support within the process chamber; providing the substrate onto the substrate support; providing a plurality of electrical bias sources; providing a first aperture plate ...

Signed and Sealed this
Fourteenth Day of November, 2023

*Katherine Kelly Vidal*
Katherine Kelly Vidal
*Director of the United States Patent and Trademark Office*